United States Patent
Koyama et al.

(10) Patent No.: US 10,037,901 B2
(45) Date of Patent: Jul. 31, 2018

(54) SUBSTRATE LIQUID TREATMENT APPARATUS, METHOD OF CLEANING SUBSTRATE LIQUID TREATMENT APPARATUS AND NON-TRANSITORY STORAGE MEDIUM

(71) Applicant: TOKYO ELECTRON LIMITED, Tokyo (JP)

(72) Inventors: Kazuya Koyama, Koshi (JP); Hiromi Kiyose, Koshi (JP); Katsufumi Matsuki, Koshi (JP); Shuhei Takahashi, Koshi (JP); Hideki Nishimura, Koshi (JP); Takashi Uno, Koshi (JP); Hirotaka Maruyama, Koshi (JP)

(73) Assignee: Tokyo Electron Limited, Minato-ku (JP)

( * ) Notice: Subject to any disclaimer, the term of this patent is extended or adjusted under 35 U.S.C. 154(b) by 343 days.

(21) Appl. No.: 14/713,275

(22) Filed: May 15, 2015

(65) Prior Publication Data

US 2015/0328668 A1 Nov. 19, 2015

(30) Foreign Application Priority Data

May 16, 2014 (JP) ................. 2014-102540

(51) Int. Cl.
*H01L 21/67* (2006.01)
*B08B 9/032* (2006.01)
(52) U.S. Cl.
CPC ........ *H01L 21/67017* (2013.01); *B08B 9/032* (2013.01); *H01L 21/67023* (2013.01)

(58) Field of Classification Search
CPC ......... H01L 21/67017; H01L 21/67023; H01L 21/67028; H01L 21/6704; H01L 21/67051; H01L 21/67057; H01L 21/67075; H01L 21/6708; H01L 21/67086; B08B 9/032; B08B 9/0321; B08B 9/0325
See application file for complete search history.

(56) References Cited

U.S. PATENT DOCUMENTS

2010/0108103 A1* 5/2010 Minami ............ H01L 21/67051
  134/26
2013/0220478 A1 8/2013 Kasahara et al.

FOREIGN PATENT DOCUMENTS

JP 2006-080547 A1 3/2006
JP 2013-175552 A1 9/2013

* cited by examiner

*Primary Examiner* — David G Cormier
(74) *Attorney, Agent, or Firm* — Burr & Brown, PLLC

(57) ABSTRACT

A substrate liquid treatment apparatus includes: at least one processing unit that processes a substrate with a treatment liquid; a storage tank that stores the treatment liquid; a circulation line through which the treatment liquid discharged from the storage tank into the circulation line is returned to the storage tank; a branch supply line that is branched from the circulation line to supply the treatment liquid to the processing unit; a recovery line that returns to the storage tank the treatment liquid having been supplied to the substrate in the processing unit; a distribution line connecting the circulation line and the recovery line; and a shutoff valve, provided on the distribution line, that is opened when cleaning of the recovery line is performed.

8 Claims, 2 Drawing Sheets

SUBSTRATE LIQUID TREATMENT APPARATUS, METHOD OF CLEANING SUBSTRATE LIQUID TREATMENT APPARATUS AND NON-TRANSITORY STORAGE MEDIUM

CROSS REFERENCE TO RELATED APPLICATIONS

This application is based upon and claims the benefit of priority from the prior Japanese Patent Application No. 2014-102540 filed on May 16, 2014, the entire contents of which are incorporated herein by reference.

FIELD OF THE INVENTION

The present invention relates to a technique for cleaning a treatment liquid recovery line in a substrate liquid treatment apparatus, through which a treatment liquid having been supplied to a substrate is recovered so as to be reused.

BACKGROUND ART

In manufacturing of a semiconductor device, a substrate such as a semiconductor wafer is subjected to various liquid treatments (processes) such as a wet etching process, a chemical cleaning process and so on. In usual, such a liquid treatments is performed by a substrate liquid treatment apparatus including a plurality of liquid processing units and a treatment liquid supplying mechanism that supplies a chemical liquid to the liquid processing units. The treatment liquid supply mechanism includes, for example, a storage tank that stores a chemical liquid as a treatment liquid, and a circulation line through which the chemical liquid in the storage tank circulates. A plurality of branch supply lines are branched from the circulation line to allow the chemical liquid to be supplied to the respective liquid processing units through the corresponding branch supply lines. Some types of chemical liquids are reusable. For reusing such a chemical liquid, the chemical liquid having been used in the respective liquid processing units is recovered through a recovery line into the chemical liquid storage tank (see, e.g., JP2013-175552A and JP2006-080547A).

The chemical liquid does not always rush through the recovery line, and the recovery line is not always filled with the chemical liquid. Thus, after long time operation of the substrate liquid treatment apparatus, substances derived from the chemical liquid or reaction products generated through reaction between the chemical liquid and substrate surface structure forming materials are deposited or adhered on inner surfaces of piping members forming the recovery line. Such deposits or contaminants in the piping members sometimes peel off therefrom irregularly. The peeled contaminants flow into the storage tank and flows out therefrom into the circulation line. Since the circulation line is provided with a filter, particles derived from the contaminants are usually prevented from being supplied to the processing units.

However, the contaminants trapped by the filter clogs the filter. If clogging of the filter progresses, the contaminants having been trapped by the filter may be pushed out to the downstream side. In this case, product substrates may suffer from contamination beyond the allowable limit. Even if it is not the case, it may be necessary to replace or clean the filter and to clean the circulation line in order to cope with the contamination. In general, operation time management can prevent the aforementioned contamination problem. However, if a great amount of contaminants suddenly flow from the recovery line into the circulation line, the aforementioned filter trouble may occur suddenly. Stopping of the operation of the substrate liquid treatment apparatus for dealing with the trouble at an unintended timing impedes efficient use of the apparatus. Thus, in order to prevent unexpected peeling-off of a large amount of contaminants, it is desired to prevent a large amount of contaminants from being deposited on the recovery line.

SUMMARY OF THE INVENTION

The present invention provides a technique that can prevent a recovery line a substrate liquid treatment apparatus for recovery of a treatment liquid from being contaminated.

In one embodiment, the present invention provides a substrate liquid treatment apparatus, which includes: at least one processing unit that processes a substrate with a treatment liquid; a storage tank that stores the treatment liquid; a circulation line through which the treatment liquid discharged from the storage tank into the circulation line is returned to the storage tank; a branch supply line that is branched from the circulation line to supply the treatment liquid to the processing unit; a recovery line that returns to the storage tank the treatment liquid having been supplied to the substrate in the processing unit; a distribution line connecting the circulation line and the recovery line; and a shutoff valve, provided on the distribution line, that is opened when cleaning of the recovery line is performed.

In another embodiment, the present invention provides a method of cleaning a substrate liquid treatment apparatus. The substrate liquid treatment apparatus includes: at least one processing unit that processes a substrate with a treatment liquid; a storage tank that stores the treatment liquid; a drain line that drains the treatment liquid from the storage tank; a treatment liquid supplying line that supplies the treatment liquid from a treatment liquid source into the storage tank; a circulation line through which the treatment liquid discharged from the storage tank into the circulation line is returned to the storage tank; a branch supply line that is branched from the circulation line to supply the treatment liquid to the processing unit; a recovery line that returns to the storage tank the treatment liquid having been supplied to the substrate in the processing unit; a distribution line connecting the circulation line and the recovery line; and a shutoff valve provided on the distribution line. The method including: (a) discharging the treatment liquid existing in the storage tank; (b) after (a), supplying the treatment liquid from the treatment liquid supplying line into the storage tank; (c) circulating the treatment liquid through the storage tank and the circulation line. When (c) is being performed, the shutoff valve is opened to feed a part of the treatment liquid circulating through the circulation line into the recovery line via the distribution line thereby to clean the recovery line.

Further, in yet another embodiment, the present invention provides a non-transitory storage medium storing a program for executing the aforementioned cleaning method.

According to the aforementioned embodiments of the present invention, when the circulation line is being cleaned with a cleaning liquid, a part of the cleaning liquid circulating through the circulation line into the recovery line through the distribution line to clean the recovery line, so that the the recovery line can be prevented from being contaminated.

EMBODIMENT OF CARRYING OUT THE INVENTION

A preferred embodiment will be described herebelow with reference to the drawings.

Figure 1:
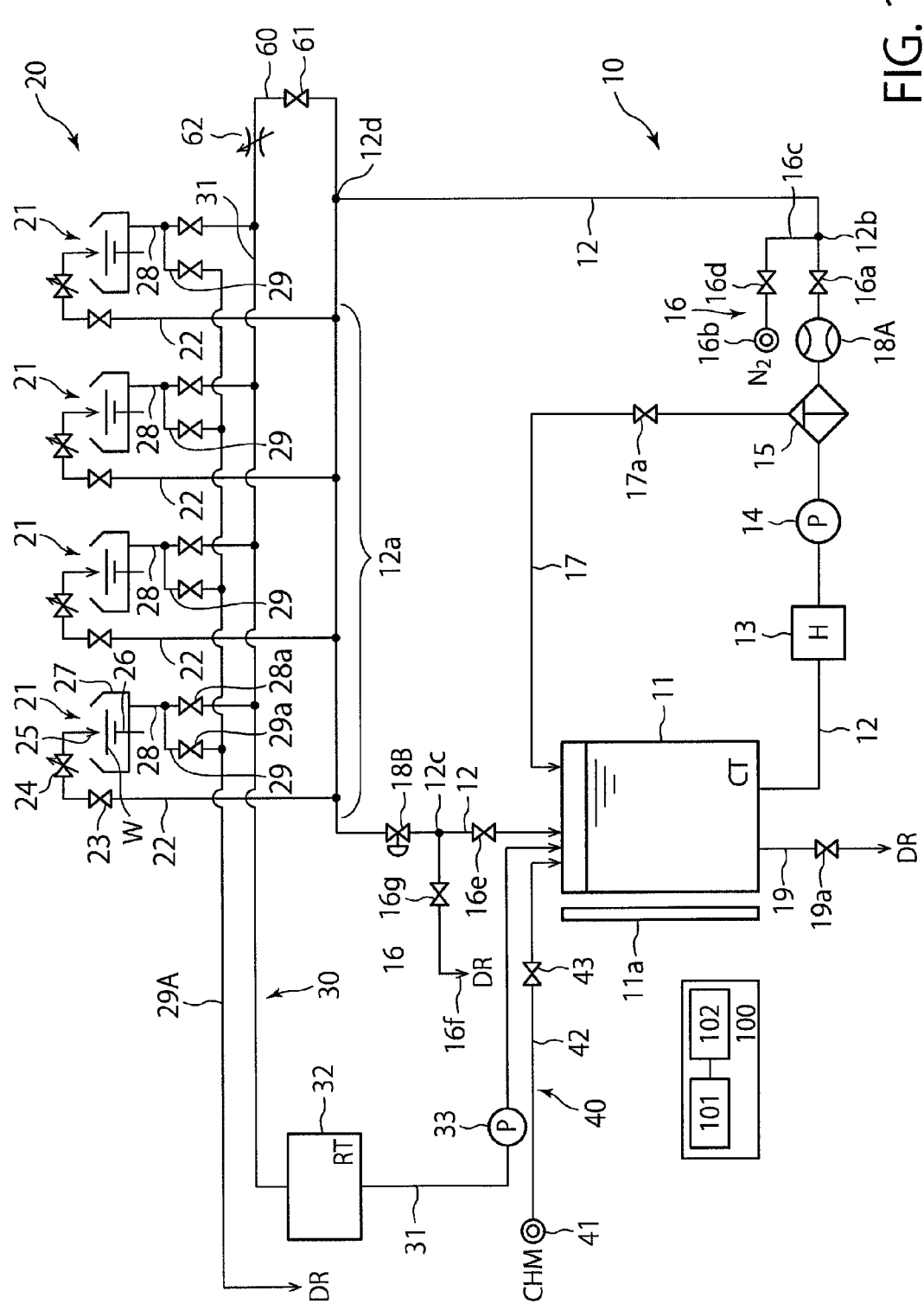
FIG. 1 is a schematic piping and instrument diagram showing an overall structure of a substrate processing system (substrate liquid treatment apparatus).

As shown in FIG. 1, a substrate liquid treatment apparatus includes: a treatment liquid circulation system 10; a process block 20 that processes a process target substrate, such as a semiconductor wafer (hereinafter referred to simply as "substrate W"), with a treatment liquid circulating through the treatment liquid circulation system 10; and a treatment liquid recovery system 30 that returns the treatment liquid discharged from the process block 20 to the treatment liquid circulation system 10 so as to reuse the treatment liquid.

The treatment liquid circulation system 10 includes a storage tank 11 that stores the treatment liquid, and a circulation line (circulation pipeline) 12 both ends of which are connected to the storage tank 11. The circulation line 12 is provided with a heater 13 that heats the treatment liquid, a circulation pump 14 that feeds the treatment liquid, a filter 15 that removes contaminants such as particles contained in the treatment liquid, and a flowmeter 18A that measures flow rate of the treatment liquid flowing through the circulation line 12, which are arranged along the flowing direction in this order starting from the storage tank 11. The circulation line 12 is further provided with a constant pressure valve 18B on the downstream side of a connection area 12a, which is described below.

The circulation line 12 is equipped with a circulation line purging mechanism 16 for purging the circulation line 12 by means of a gas. The circulation line purging mechanism 16 is composed of a shutoff valve 16a provided on the circulation line 12 on the downstream side of the filter 15, an $N_2$ gas (nitrogen gas) source 16b as a purge-gas source, a purge-gas supplying line 16c connected to the circulation line 12 at a first position 12b on the downstream side of the shutoff valve 16a, and a shutoff valve 16d provided on the purge gas supplying line 16c. In addition, the circulation line purging mechanism 16 has a shutoff valve 16e provided on the circulation line 12 at a position on the downstream side of the below-described connection area 12a of the circulation line 12 and on the slightly upstream side of the storage tank 11, a drain line 16f connected to the circulation line 12 at a second position 12c on the upstream side of the shutoff valve 16e, and a shutoff valve 16g provided on the drain line 16f.

The filter 15 is connected to a degassing line 17 for removing bubbles contained in the treatment liquid flowing through the circulation line 12. The degassing line 17 is connected to the storage tank 11. A shutoff valve 17a is provided on the degassing line 17. A drain line 19 is connected to the storage tank 11, and a shutoff valve 19a is provided on the drain line 19.

In the process block 20, there are provided a plurality of processing units 21 each having the same structure. A part of the circulation line 12 of the treatment liquid circulation system 10 passes through process block 20. In the connection area 12a inside the process block 20 of the circulation line 12, branch lines 22 that supply the respective processing units 21 with the treatment liquid are connected to the circulation line 12. The connection area 12a, in which the branch lines 22 are connected to the circulation line 12, is located on the downstream side of the first position 12b to which the purge gas supplying line 16c of the circulation line purging mechanism 16 is connected, and on the upstream side of the second position 12c to which the drain line 16f of the circulation line purging mechanism 16 is connected.

Each of the branch lines 22 is provided with a shutoff valve 23 and a flow control valve 24. The branch line 22 is connected to a treatment liquid supplying nozzle 25. Thus, the treatment liquid is supplied from the treatment liquid supplying nozzle 25 at a controlled flow rate to a substrate W held by a substrate holding unit 26, whereby the substrate W is subjected to a predetermined liquid treatment such as a cleaning process or a wet etching process. Although FIG. 1 illustrates the four processing units 21, any number of processing units 21 may be provided in the process block 20.

In each processing unit 21, a recovery cup 27 is disposed around the substrate holding unit 26. The recovery cup 27 receives the treatment liquid that has been ejected from the treatment liquid supplying nozzle 25 so as to be used for processing the substrate and then scattered from the substrate. The treatment liquid received in the recovery cup 27 is discharged from the recovery cup 27 through a liquid discharging line 28 which is connected to a bottom part of the recovery cup 27. The liquid discharging line 28 can be also regarded as a branch recovery line branched from a recovery line 31 described below.

The treatment liquid recovery system 30 is composed of a recovery line 31, a recovery tank 32 provided on the recovery line 31, and a return pump 33 provided on the recovery line 31 on the downstream side of the recovery tank 32. A downstream end of the recovery line 31 is connected to the storage tank 11. The return pump 33 feeds the treatment liquid recovered to the recovery tank 32 to the storage tank 11. The liquid discharging line (branch recovery line) 28 of each processing unit 21 is connected to the recovery line 31 on the upstream side of the recovery tank 32.

A branch draining line 29 is branched from the liquid discharging line 28 of each processing unit 21. The respective branch draining lines 29 merge into a draining line 29A connected to a factory waste liquid system. A shutoff valve 28a is provided on the liquid discharging line 28, and a shutoff valve 29a is provided on the branch draining line 29. By switching these shutoff valves 28a and 29a, it is possible to switch between two conditions, one being a condition in which the treatment liquid flowing from the processing unit 21 into the liquid discharging line 28 flows through the liquid discharging line 28 into the recovery line 31, the other being a condition in which the treatment liquid flowing from the processing unit 21 into the liquid discharging line 28 flows into the branch draining line 29. Some types of treatment liquids flowing from the processing units 21 into the liquid discharging line 28 is not desired to be recovered (for example, a treatment liquid excessively diluted with deionized water used in a deionized-water rinsing process as a preprocess, or a treatment liquid containing a great amount of contaminants which are discharged in an initial step of the cleaning process). Such a treatment liquid is discarded through the branch draining line 29.

A distribution line 60 is branched from the circulation line 12 at a third position 12d on the upstream side of the connection area 12a. The distribution line 60 is connected to the recovery line 31 such that the liquid (in particular, below-described treatment liquid for cleaning) flowing through the circulation line 12 flows into the recovery line 31 from a connecting position at which the liquid discharging line 28, which is connected to the most upstream side of the recovery line 31, is connected to the recovery line 31, or from a position on the upstream side of the connecting position. The distribution line 60 is connected to the recovery line 31 at a connecting position such that the liquid (in particular, the below-described treatment liquid for cleaning) flowing through the circulation line 12 flows into the recovery line 31 from the connecting position, which connecting position is located at a joint (at which the liquid discharging line 28, which is connected to the most upstream side of the recovery line 31, is connected to the recovery line 31) or the upstream side of the joint on the recovery line 31. The distribution line 60 is provided with a shutoff valve 61 and a flow control valve 62 in this order from the upstream side.

The substrate liquid treatment apparatus further includes a treatment liquid replenishing apparatus 40 that supplies a treatment liquid for replacement or replenishment to the treatment liquid circulation system 10. The treatment liquid replenishing apparatus 40 is composed of a treatment liquid source 41, a treatment liquid supplying line 42 that connects the treatment liquid source 41 and the storage tank 11 of the treatment liquid circulation system 10, and a shutoff valve 43 provided on the treatment liquid supplying line 42. The structure of the treatment liquid source 41 is arbitrary. For example, the treatment liquid source 41 may be composed of a replenishment tank (not shown) that stores a treatment liquid to be replenished to the storage tank 11, an equipment (not shown) that supplies a raw material liquid(s) of the treatment liquid (for example, if the treatment liquid is a diluted chemical liquid, the raw material liquids are a concentrated chemical liquid and deionized water as a diluting liquid) to the replenishment tank, an equipment (e.g., a pump) that feeds the treatment liquid from the not-shown replenishment tank to the treatment liquid supplying line 42.

There is a substrate liquid treatment apparatus that processes a substrate with the use of plural kinds of treatment liquids. In this case, a plurality of the treatment liquid supplying nozzles 25 are provided in each of the processing units 21 in the process block 20. Also, a plurality of the treatment liquid circulation systems 10, a plurality of the treatment liquid recovery systems 30 and a plurality of the treatment liquid replenishment apparatuses 40 are provided according to need. Some types of treatment liquids are not allowed to be returned to the storage tank 11. The recovery line 31 for such a non-returnable treatment liquid is provided as a drain line that is directly connected to the factory waste liquid system, and the recovery tank 32 and the return pump 33 are not provided. FIG. 1 only shows, among constituent elements of the substrate liquid treatment apparatus, constituent elements involved in the supply and recovery of one type of treatment liquid that can be recovered and reused.

The substrate liquid treatment apparatus includes a control unit 100. The control unit 100 is, e.g., a computer and includes a control section 101 and a storage section 102. The storage section 102 stores a program that controls various processes performed in the substrate liquid treatment apparatus. The control section 101 reads out and executes the program stored in the storage section 102 to thereby control the operation of the substrate liquid treatment apparatus.

Such a program may be stored in a computer-readable storage medium. The program may be installed from the storage medium to the storage section 102 of the control unit 100. The computer-readable storage medium is, for example, a hard disc drive (HD), a flexible disc (FD) a compact disc (CD), a magnet-optical disc (MO), a memory card or the like.

Next, the operation of the foregoing substrate liquid treatment apparatus is explained.

During a normal operation of the substrate liquid treatment apparatus, the treatment liquid is circulated by the circulation pump 14 through the circulation line 12, while the shutoff valves 16a and 16e are opened. When the treatment liquid is being circulated, the shutoff valves 19a, 16d, 16g and 17a are closed, and the shutoff valve 61 of the distribution line 60 is also closed. Namely, during the normal operation, the treatment liquid is not supplied from the circulation line 12 to the recovery line 31 through the distribution line 60. The heater 13 maintains the treatment liquid at a suitable temperature according to need. Contaminants such as particles contained in the treatment liquid are removed by the filter 15. According to need, the treatment liquid is fed from the circulation line 12 to the respective processing units 21 through the corresponding branch lines 22, whereby substrates W are processed with the treatment liquid. The liquid treatment of the substrates W is performed under the control of the control unit 100.

In addition, during the normal operation, the treatment liquid having been used for processing the substrate W in each processing unit 21 is discharged from the corresponding liquid discharging line 28. The discharged treatment liquid flows into the recovery line 31 so as to be stored in the recovery tank 32. The liquid stored in the recovery tank 32 is fed to the storage tank 11 by driving the return pump 33, according to need. The above operation during the normal operation is performed under the control of the control section 101, which controls the respective functional components of the substrate liquid treatment apparatus, based on a process recipe stored in the storage section 102.

When the liquid treatment is being performed in at least one of the processing units 21 during the normal operation of the substrate liquid treatment apparatus, the shutoff valve 61 of the distribution line 60 may be opened to allow a part of the treatment liquid flowing through the circulation line 12 to flow into the recovery line 31 through the distribution line 60. This operation causes a clean treatment liquid to flow through the recovery line 31 from the upstream end thereof, so that the recovery line 31 is prevented from being contaminated with contaminants. At this time, it is preferable to control the opening degree of the flow control valve 62 such that the distribution of the treatment liquid to the recovery line 31 does not affect the flow rate(s) of the treatment liquid which is being supplied from the circulation line 12 to the processing unit(s) 21. When the liquid treatment is not being performed in any of the processing units 21, a part or all of the treatment liquid flowing through the circulation line 12 may be allowed to flow through the recovery line 31, which can also prevent the recovery line 3 from being contaminated with contaminants. Also in this case, it is preferable to control the opening degree of the flow control valve 62 such that the distribution of the treatment liquid to the recovery line 31 will not affect the flow rate(s) of the treatment liquid to be supplied to the processing unit(s) 21 at the starting of the liquid treatment in the processing unit(s) 21.

Next, a procedure for replacing the treatment liquid is explained with reference to a flowchart shown in FIG. 2. The following procedure for replacing the treatment liquid can be automatically performed under the control of the control unit 100, based on a treatment liquid replacement recipe stored in the storage section 102.

In order to replace the treatment liquid, loading of the substrates W into the processing units 21 is stopped. After substrates W have been processed and unloaded from all the processing units 20, the steps shown in FIG. 2 are started.

Figure 2:
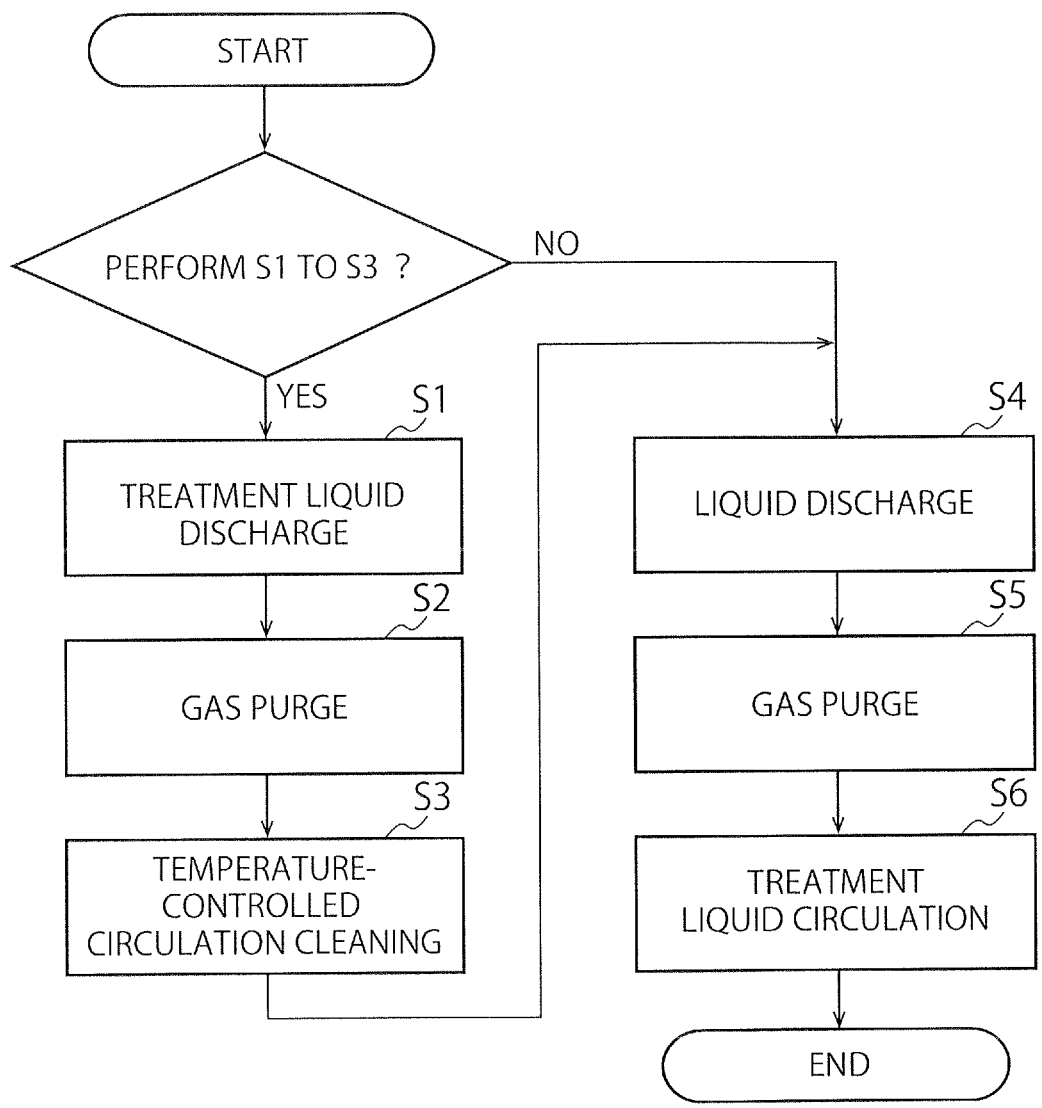
FIG. 2 is a flowchart showing a procedure for replacement of the treatment liquid.

The treatment liquid replacement process includes a pipe cleaning process having steps S1 to S3 shown in the flowchart of FIG. 2, and a liquid replacement process having steps S4 to S6. Firstly, whether or not the pipe cleaning process should be performed is determined. When the pipe cleaning process is performed, the program proceeds to the step S1. On the other hand, when the pipe cleaning process is not performed, the program proceeds to the step S4.

<<Pipe Cleaning Process>>
<Treatment Liquid Discharging Step>

Firstly, the shutoff valve 19a of the drain line 19 is opened to discharge the liquid in the storage tank 11. Then, with the shutoff valve 19a being opened, the circulation pump 14 is actuated to expel the remaining liquid from a section of the circulation line 12 extending from the storage tank 11 to the circulation pump 14, into a section of the circulation line 12 downstream of the circulation pump 14. This step S1 is performed by continuously operating the circulation pump 14 until the section of the circulation line 12 upstream of the circulation pump 14b becomes empty so that the circulation pump 14 does not pump the liquid any more (empty-operating state) (The above is step S1).

<Gas Purging Step>

Immediately after the treatment liquid discharging step, the liquid remains in the section of the circulation line 12 extending from the circulation pump 14 to the storage tank 11 with respect to the liquid flow direction. Thus, the N$_2$ gas purging step is performed in order to expel the remaining liquid. Firstly, the shutoff valves 16a and 16e provided on the circulation line 12 are closed, and the shutoff valve 16d provided on the purge gas supplying line 16c and the shutoff valve 16g provided on the drain line 16f are opened. Thus, N$_2$ gas flows from the N$_2$ gas source 16d into the circulation line 12 through the purge gas supplying line 16c. The N$_2$ gas flows through the circulation line 12 so as to be discharged from the drain line 16f. Together with the N$_2$ gas flow, the liquid in the section of the circulation line 12 extending from the first position 12b to the second position 12c is forcibly discharged through the drain line 16f.

Just before the end of the gas purging step (e.g., during a period between 5 seconds before the end of the gas purging step and the end of the gas purging step), the shutoff valve 16e is opened as well as the shutoff valve 16g. Thus, the liquid in the section of the circulation line 12 extending from the second position 12c to the storage tank 11 can be drained, while minimizing an amount of contaminants flown into the storage tank 11 (The above is step S2).

<Temperature-Controlled Circulation Cleaning Step>

Then, the shutoff valve 16a of the circulation line 12 and the shutoff valve 16g of the drain line 16f are opened, and the shutoff valve 16e of the circulation line 12, the shutoff valve 16d of the purge gas supplying line 16c and the shutoff valve 19a of the drain line 19 are closed. Under this condition, the shutoff valve 43 of the treatment liquid supplying line 42 is opened, so that a predetermined amount of treatment liquid, which serves as a cleaning liquid (specifically, for example, the same chemical liquid as the chemical liquid used for processing a substrate in the processing unit 21), is supplied from the treatment liquid source 41 into the storage tank 11. The amount of the treatment liquid to be supplied into the storage tank 11 preferably corresponds to the minimum amount that enables the treatment liquid to be circulated through the circulation line 12 without any trouble, or an amount slightly larger than the minimum amount. To be specific, an amount of the treatment liquid that results in a liquid level of the treatment liquid in the storage tank 11, which is about ¼ to ½ of the liquid level of the treatment liquid in the storage tank 11 during the normal operation, is supplied to the storage tank 11, for example.

When the liquid level sensor 11a attached to the storage tank 11 detects that the predetermined amount of treatment liquid has been stored in the storage tank 11, the supply of the treatment liquid from the treatment liquid source 41 is stopped, and the circulation pump 14 is activated so that the treatment liquid circulates through the circulation line 12. In addition, the treatment liquid circulating through the circulation line 12 is heated by the heater 13 such that the treatment liquid is maintained at a predetermined temperature. The aforementioned predetermined temperature of the treatment liquid is higher than a temperature at which the treatment liquid is supplied to a substrate W in the processing unit 21. In one example, the temperature at which the treatment liquid is supplied to the substrate W in the processing unit 21 is 25° C., while the aforementioned predetermined temperature of the treatment liquid heated by the heater 13 is 40° C. The treatment liquid having a temperature higher than the temperature for processing the substrate W can remove contaminants more efficiently. If the solubility of contaminants in the treatment liquid does not depend on the temperature, the temperature of the treatment liquid used for cleaning may be the same as that used for processing the substrate W.

In addition, at this time, the shutoff valve 61 of the distribution line 60, which has been closed till then, is opened, and the opening degree of the flow control valve 62 is controlled, so that a part of the heated treatment liquid flowing through the circulation line 12 flows into the recovery line 31 through the distribution line 60. Then, the return pump 33 of the recovery line 31 is activated, so that the treatment liquid in the recovery tank 32 returns to the storage tank 11. That is, the treatment liquid flowing from the circulation line 12 continuously flows through the recovery line 31. If the shutoff valve 61 of the distribution line 60 has been opened and the opening degree of the flow control valve 62 has been adjusted to the predetermined opening degree from the time point at which the liquid treatment of the substrates W is being performed in the processing units 20, the shutoff valve 61 is kept opened continuously. In this case, the opening degree may be maintained or increased. In the latter case, the flow rate of the treatment liquid flowing through the recovery line 31 becomes larger than the flow rate during execution of the liquid treatment of the substrates in the processing units 20, so that the cleaning efficiency can be improved.

The treatment liquid (chemical liquid) circulating through the circulation line 12 efficiently removes contaminants adhering on liquid contact surfaces of the circulation line 12 (including the storage tank 11) and various instruments (heater, pump, flowmeter, valves and so on) provided on the circulation line 12. In particular, gelatinous substances (main substances causing filter clogging) trapped in the filter 15 are melted by the heated treatment liquid, and the melted substances flow into the circulation line 12. That is, the heated chemical liquid passing through the filter 15 can also clean the filter 15.

As described in the "background art" part of the specification, during the normal operation of the substrate processing system, contaminants are likely to be adhered or deposited on the liquid contact surfaces of the recovery line 31 and the various instruments provided on the recovery line 31. These contaminants can be also efficiently removed by the heated treatment liquid (chemical liquid) flowing into the recovery line 31 through the distribution line 60. The removed contaminants flow into the storage tank 11. The contaminants flowing into the storage tank 11 flows out therefrom into the circulation line 12. Soluble components of the contaminants continuously circulate through the circulation line 12, while insoluble components are trapped by the filter 15 (The above is step S3).

Since the old treatment liquid also exists in the degasing line 17, it is preferable that the shutoff valve 17a is opened to clean the degassing line 17 with the chemical liquid in at least a part of the time period during which the temperature-controlled circulation cleaning step (step S3) is performed.

While the temperature-controlled circulation cleaning step is being performed, dummy dispensing from the treatment liquid supplying nozzle 25 may be performed by opening the shutoff valve 23 of each branch line 22. The "dummy dispensing" generally means an operation in which the treatment liquid nozzle 25 ejects the treatment liquid toward a liquid receiver (not shown) disposed outside the recovery cup 27, with the treatment liquid nozzle 25 being located in a home position (i.e., the standby position outside the recovery cup 27). In general, the treatment liquid received by the liquid receiver is discharged to the factory waste liquid system. By performing the dummy dispensing, the branch lines 22 and the treatment liquid ejection paths in the treatment liquid supplying nozzles 25 can be cleaned.

While the temperature-controlled circulation cleaning step is being performed, an inside of the processing unit 21, in particular, the recovery cup 27 and the liquid discharging line 28 (draining pipe) may be cleaned by performing a dummy operation of each processing unit 21. The dummy operation can be performed by using a dummy substrate (preferably a substrate made of a material that is not reactive to the treatment liquid). In the dummy operation, the treatment liquid is supplied to the dummy substrate from the treatment liquid supplying nozzle 25, similarly to the normal process to a wafer W. At this time, the shutoff valve 23 of each branch line 22 is opened so that the temperature-controlled treatment liquid flowing through the circulation line 12 is supplied from the corresponding treatment liquid supplying nozzle 25 to the dummy substrate. The treatment liquid supplied to the dummy substrate can remove contaminants deposited or adhering to inner surfaces of the recovery cup 27 and the liquid discharging line 28. The removed contaminants flow into the recovery line 31 and then flow downstream together with the treatment liquid flowing from the distribution line 60 into the recovery line 31.

<<Liquid Replacement Process>>
<Treatment Liquid Discharging Step>

After the circulation cleaning step has been performed, the circulation pump 14 is stopped. Then, the same procedure as the above step S1 is performed again (step S4). Even if the pipe cleaning step is skipped and the process flow is started from the step S4, the contents of the step S4 are the same as those of the aforementioned step S1.

<Gas Purging Step>

Then, the same procedure as that of the step S2 is performed (step S5). Even if the pipe cleaning step is skipped and the process flow is started from the step S4, the contents of the step S5 are the same as those of the aforementioned step S2.

<Treatment Liquid Circulation Step>

Then, the shutoff valve 16a of the circulation line 12 and the shutoff valve 16g of the drain line 16f are opened, and the shutoff valve 16e of the circulation line 12, the shutoff valve 16d of the purge gas supplying line 16c and the shutoff valve 19a of the drain line 19 are closed. If the pipe cleaning step (steps S1 to S3) is performed before the liquid replacement step (steps S4 to S6), the shutoff valve 61 of the distribution line 60, which was opened in the temperature-controlled circulation cleaning step (step S3), is preferably closed by this time point at the latest. Under this condition, the shutoff valve 43 of the treatment liquid supplying line 42 is opened, so that a predetermined amount of treatment liquid (treatment liquid for processing a substrate in the processing unit 21, e.g., chemical liquid) is supplied from the treatment liquid source 41 into the storage tank 11. At this time, the treatment liquid is supplied into the storage tank 11 such that the liquid level of the treatment liquid in the storage tank 11 reaches the liquid level for the normal operation of the substrate treatment system.

Upon detection of the situation where the predetermined amount of treatment liquid was stored in the storage tank 11, the supply of the treatment liquid from the treatment liquid source 41 is stopped, and the circulation pump 14 is activated so that the treatment liquid circulates through the circulation line 12. In addition, the temperature of the treatment liquid flowing through the circulation line 12 is controlled, with the use of the heater 13, to a temperature (e.g., 25° C.) at which a wafer W is processed by the processing unit 21. The actuation of the circulation pump 14 and the temperature control of the treatment liquid may be started before the liquid level of the treatment liquid in the storage tank 11 reaches the predetermined liquid level. Also in the temperature-controlled circulation step, the liquid contact surfaces of the storage tank 11, the circulation line 12 and the instruments provided on the circulation line 12 are further cleaned by a new treatment liquid, and the removed contaminants are trapped by the filter (the above is step S6).

The temperature of the treatment liquid, which circulates through the circulation system including the storage tank 11 and the circulation line 12, is stabilized at the predetermined temperature, a treatment of a wafer W by the processing unit 21 can be started at any time point. A series of the treatment liquid replacement steps are finished. At the time when the step S6 is finished, if the particle level in the circulation line 12 is not sufficiently low, the steps S4 to S6 may be performed again.

According to the above embodiment, the liquid flowing through the circulation line 12 can be introduced to the recovery line 31 through the distribution line 60. Thus, while the circulation line 12 and the instruments provided thereon are being cleaned by circulating the cleaning liquid through the circulation line 12, the recovery line 31 and the instruments provided thereon can be efficiently cleaned at the same time. Moreover, the above function can be realized with a very low cost, since components to be added are only a pipe(s) constituting the distribution line 60, pipe joints and the valves 61 and 62.

In addition, according to the above embodiment, since the treatment liquid, which is used for cleaning a substrate W in the processing unit 21, is heated and used as a cleaning liquid, contaminants can be efficiently removed. In particular, the gelatinous substance trapped by the filter 15 can be dissolved, whereby the filter is also cleaned. As compared with a case where deionized water or heated deionized water is used as a cleaning liquid, the cleaning efficiency can be significantly improved. Further, it is not necessary to perform any additional step (e.g., a step in which the circulation line 12 is flushed with deionized water to remove the cleaning liquid from the circulation line 12) after the cleaning liquid has been discharged and before a new treatment liquid is supplied. As a result, the treatment liquid replacement can be efficiently performed at a short time period.

In addition, deposition or adhesion of a large amount of contaminants onto the surfaces of the recovery line 31 can be prevented by suitably cleaning the recovery line 31. Thus, occurrence of a filter trouble at an unexpected timing and sudden increase of the particle level can be prevented.

Before the steps S4 to S6 are performed, the circulation line 12 may be flushed by using deionized water as a cleaning liquid, for example. For this purpose, a deionized-water supply unit for supplying deionized water to the storage tank 11 may be provided.

The liquid replacement step (steps S4 to S6) is periodically performed. Since the pipe cleaning step is performed before the liquid replacement step, it is not necessary to stop the treatment of the substrates only for cleaning the pipe. Thus, the frequency of stopping of the substrate treatment can be reduced, which prevents lowering of the operation rate of the apparatus. The pipe cleaning step may be performed for each time when the liquid replacement step is performed, or at every predetermined number of times. The timing of performing the pipe cleaning step may be suitably determined in view of the contamination level of the pipes.

In a case where the processing units 21 performs a liquid treatment using a heated treatment liquid, if the operation of the processing units 21 are stopped for a long time, the temperature of the recovery line 31 may lower to room temperature. In such a case, the heated treatment liquid flowing into the recovery line 31 from each processing unit 21 may be cooled by the recovery line 31, so that the temperature of the treatment liquid in the storage tank 11 may lower. In order to avoid such a situation, the shutoff valve 61 may be opened before or simultaneously with the restarting of the liquid treatment in the processing units 21 so as to supply a heated treatment liquid to the recovery line 31 thereby to raise the temperature of the recovery line 31.

What is claimed is:

1. A substrate liquid treatment apparatus comprising:
    a plurality of processing units, each of the plurality of processing units configured to process a substrate with a treatment liquid;
    a storage tank that stores the treatment liquid;
    a circulation line through which the treatment liquid discharged from the storage tank into the circulation line is returned to the storage tank;
    a plurality of branch supply lines, each branch supply line of the plurality of branch supply lines being connected to the circulation line to supply the treatment liquid to a respective processing unit of the plurality of processing units;
    a plurality of liquid discharging lines, each discharging line of the plurality of discharging lines being connected to a respective processing unit of the plurality of processing units to discharge the treatment liquid from the respective processing unit of the plurality of processing units;
    a recovery line connected to the liquid discharging lines at connection points on the recovery line adapted to allow the treatment liquid having been supplied to the substrates in the processing units to return to the storage tank;
    a distribution line having an upstream end thereof connected to the circulation line and a downstream end thereof connected to an upstream end of the recovery line, the upstream end of the recovery line being positioned at or upstream of the most upstream one of the connection points, the distribution line failing to pass through any one of the processing units; and
    a shutoff valve, provided on the distribution line, that is opened when cleaning of the recovery line is performed.

2. The substrate liquid treatment apparatus according to claim 1, further comprising a control unit that controls opening and closing operation of the shutoff valve,
    wherein the control unit closes the shutoff valve when a substrate is being processed in a respective processing unit of the plurality of processing units, while the control unit opens the shutoff valve to cause the treatment liquid to flow through the recovery line and the circulation line, thereby to clean the recovery line and the circulation line, when the substrate is not being processed in the respective processing unit.

3. The substrate liquid treatment apparatus according to claim 2, further comprising a heater,
    wherein the control unit controls the shutoff valve and the heater in such a manner that the treatment liquid, when the shutoff valve is opened to cause the treatment liquid to flow through the recovery line and the circulation line, has a higher temperature than the temperature of the treatment liquid when the shutoff valve is closed and the substrate is being processed in the respective processing unit.

4. The substrate liquid treatment apparatus according to claim 3, wherein the heater is provided on the circulation line at a position upstream of a position where the distribution line is connected to the circulation line.

5. The substrate liquid treatment apparatus according to claim 2, further comprising:
    a drain line that drains the treatment liquid from the storage tank; and
    a treatment liquid supplying line that supplies the treatment liquid from a treatment liquid source into the storage tank,
    wherein the cleaning of the recovery line and the circulation line is performed after draining the treatment liquid from the storage tank and after supplying the treatment liquid from the treatment liquid supplying line into the storage tank.

6. The substrate liquid treatment apparatus according to claim 3, further comprising:
    a drain line that drains the treatment liquid from the storage tank; and
    a treatment liquid supplying line that supplies the treatment liquid from a treatment liquid source into the storage tank,
    the shutoff valve being adapted to be opened to drain treatment liquid from the distribution line into the storage tank.

7. The substrate liquid treatment apparatus according to claim 1, further comprising:
    a flow control valve that controls flow rate of the treatment liquid flowing from the circulation line into the recovery line;
    a control unit that controls the shutoff valve and the flow control valve,
    wherein, when a substrate is being processed in a respective processing unit of the plurality of processing units, the control unit opens the shutoff valve, and also controls an opening degree of the flow control valve within a range ensuring that feeding of the treatment liquid from the circulation line into the recovery line does not affect a flow rate of the treatment liquid supplied to the respective processing unit.

8. The substrate processing apparatus according to claim 1, wherein the upstream end of the distribution line is connected to the circulation line at a position upstream of a connection area of the circulation line, to which connection area the plurality of branch supply lines are connected.

* * * * *